United States Patent
Aoki et al.

(10) Patent No.: US 10,877,361 B2
(45) Date of Patent: Dec. 29, 2020

(54) COOLING DEVICE AND PROJECTOR

(71) Applicant: SEIKO EPSON CORPORATION, Tokyo (JP)

(72) Inventors: Shigekazu Aoki, Matsumoto (JP); Norio Imaoka, Shimoina-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/545,026

(22) Filed: Aug. 20, 2019

(65) Prior Publication Data

US 2020/0064718 A1 Feb. 27, 2020

(30) Foreign Application Priority Data

Aug. 21, 2018 (JP) ................................ 2018-154484

(51) Int. Cl.
  *H05K 7/20* (2006.01)
  *G03B 21/16* (2006.01)
(52) U.S. Cl.
  CPC .......... *G03B 21/16* (2013.01); *H05K 7/2029* (2013.01); *H05K 7/2099* (2013.01); *H05K 7/20272* (2013.01); *H05K 7/20336* (2013.01)
(58) Field of Classification Search
  None
  See application file for complete search history.

(56) References Cited

U.S. PATENT DOCUMENTS

| | | | | |
|---|---|---|---|---|
| 5,195,577 A | * | 3/1993 | Kameda | F28D 15/0266 165/104.13 |
| 6,038,875 A | * | 3/2000 | Haselden | F25B 41/065 62/218 |
| 2010/0045940 A1 | * | 2/2010 | Takagi | G03B 21/16 353/54 |
| 2013/0025826 A1 | * | 1/2013 | Sakamoto | H01L 23/427 165/104.21 |
| 2015/0198869 A1 | * | 7/2015 | Kuriaki | G03B 21/005 353/31 |
| 2018/0270993 A1 | * | 9/2018 | Kulkarni | F28D 1/0477 |
| 2019/0204722 A1 | * | 7/2019 | Hanamura | G03B 21/16 |

FOREIGN PATENT DOCUMENTS

| | | |
|---|---|---|
| JP | S56-112482 U | 8/1981 |
| JP | S61-161558 U | 10/1986 |
| JP | S63-183385 A | 7/1988 |
| JP | 2012-083082 A | 4/2012 |
| JP | 2014-114963 A | 6/2014 |

* cited by examiner

*Primary Examiner* — Courtney L Smith
(74) *Attorney, Agent, or Firm* — Oliff PLC

(57) ABSTRACT

A cooling device includes an evaporator configured to evaporate working fluid in a liquid phase due to a heat transferred from a cooling target, a condenser configured to condense the working fluid in the vapor phase, a vapor pipe through which the working fluid changed to the vapor phase in the evaporator flow into the condenser, and a liquid pipe through which the working fluid changed to the liquid phase in the condenser flow into the evaporator. The condenser has a phase change flow channel into which the working fluid in the vapor phase inflows via the vapor pipe, and through which the working fluid changed in phase from the vapor phase to the liquid phase flow out to the liquid pipe. The phase change flow channel has a reduced diameter part having a flow channel cross-sectional area decreasing in a direction from upstream toward downstream of the working fluid.

12 Claims, 8 Drawing Sheets

COOLING DEVICE AND PROJECTOR

The present application is based on, and claims priority from JP Application Serial Number 2018-154484, filed Aug. 21, 2018, the disclosure of which is hereby incorporated by reference herein in its entirety.

BACKGROUND

1. Technical Field

The present disclosure relates to a cooling device and a projector.

2. Related Art

In the past, as a cooling device used for cooling of an electronic apparatus and so on, there has been known a loop heat pipe for transporting heat using a change of phase of a working fluid encapsulated inside (see, e.g., JP-A-2012-83082 (Document 1)).

The loop heat pipe described in Document 1 is provided with an evaporator, a condenser, a vapor pipe and a liquid pipe. The evaporator receives heat from a heat generator to evaporate the working fluid in the liquid phase to change the phase of the working fluid to the vapor phase. The vapor pipe makes the working fluid having changed to the vapor phase in the evaporator flow through the condenser. The condenser condenses the working fluid in the vapor phase due to heat radiation to change in phase to the working fluid in the liquid phase. The liquid pipe makes the working fluid having changed to the liquid phase in the condenser flow through the evaporator.

As described above, by the working fluid circulating in the loop heat pipe to transport the heat of the heat generator from the evaporator to the condenser and radiate the heat in the condenser, the heat generator is cooled.

However, in the condenser of the loop heat pipe described in Document 1, it is conceivable that the cross-sectional area of a flow channel through which the working fluid flows is constant in a range from an end part on the upstream of the working fluid to an end part on the downstream. Further, the volume of the working fluid in the vapor phase is large compared to the volume of the working fluid in the liquid phase, which is remarkable in the working fluid encapsulated in the loop heat pipe in a reduced pressure state.

Therefore, there is a problem that a pressure loss occurs when the working fluid in the vapor phase and large in volume is changed in phase to the working fluid in the liquid phase and small in volume in the process of flowing through the flow channel of the condenser, and thus, it is difficult to promptly discharge the working fluid in the liquid phase from the condenser to the liquid pipe. Such a problem becomes a factor for degrading the cooling efficiency of the heat generator with the loop heat pipe.

SUMMARY

A cooling device according to a first aspect of the present disclosure includes an evaporator configured to evaporate working fluid in a liquid phase due to a heat transferred from a cooling target to change to the working fluid in a vapor phase, a condenser configured to condense the working fluid in the vapor phase to change to the working fluid in the liquid phase, a vapor pipe through which the working fluid changed to the vapor phase in the evaporator flow into the condenser, and a liquid pipe through which the working fluid changed to the liquid phase in the condenser flow into the evaporator, wherein the condenser has a phase change flow channel into which the working fluid in the vapor phase inflows via the vapor pipe, and through which the working fluid changed in phase from the vapor phase to the liquid phase flow out to the liquid pipe, and the phase change flow channel has a reduced diameter part having a flow channel cross-sectional area decreasing in a direction from upstream toward downstream of the working fluid.

In the first aspect described above, the phase change flow channel may include a first flow channel through which the working fluid in the vapor phase inflowing via the vapor pipe flows, and a plurality of second flow channels branched from the first flow channel, and a flow channel cross-sectional area of each of the second flow channels may be smaller than a flow channel cross-sectional area of the first flow channel.

In the first aspect described above, the condenser may have a plurality of inflow ports into which the working fluid in the vapor phase inflows, and the phase change flow channel may include a plurality of inflow channels communicated with the plurality of inflow ports, and a junction channel in which the plurality of inflow channels joins.

In the first aspect described above, the phase change flow channel may have a plurality of branched flow channels located downstream of the working fluid with respect to the junction channel, the branched flow channels branched from the junction channel.

A projector according to a second aspect of the present disclosure includes a light source configured to emit light, a light modulator configured to modulate the light emitted from the light source, a projection optical device configured to project the light modulated by the light modulator, and any one of the cooling devices described above.

In the second aspect of the present disclosure, the cooling target may be the light source.

DESCRIPTION OF EXEMPLARY EMBODIMENTS

First Embodiment

A first embodiment of the present disclosure will hereinafter be described based on the drawings.

Configuration of Projector

Figure 1:
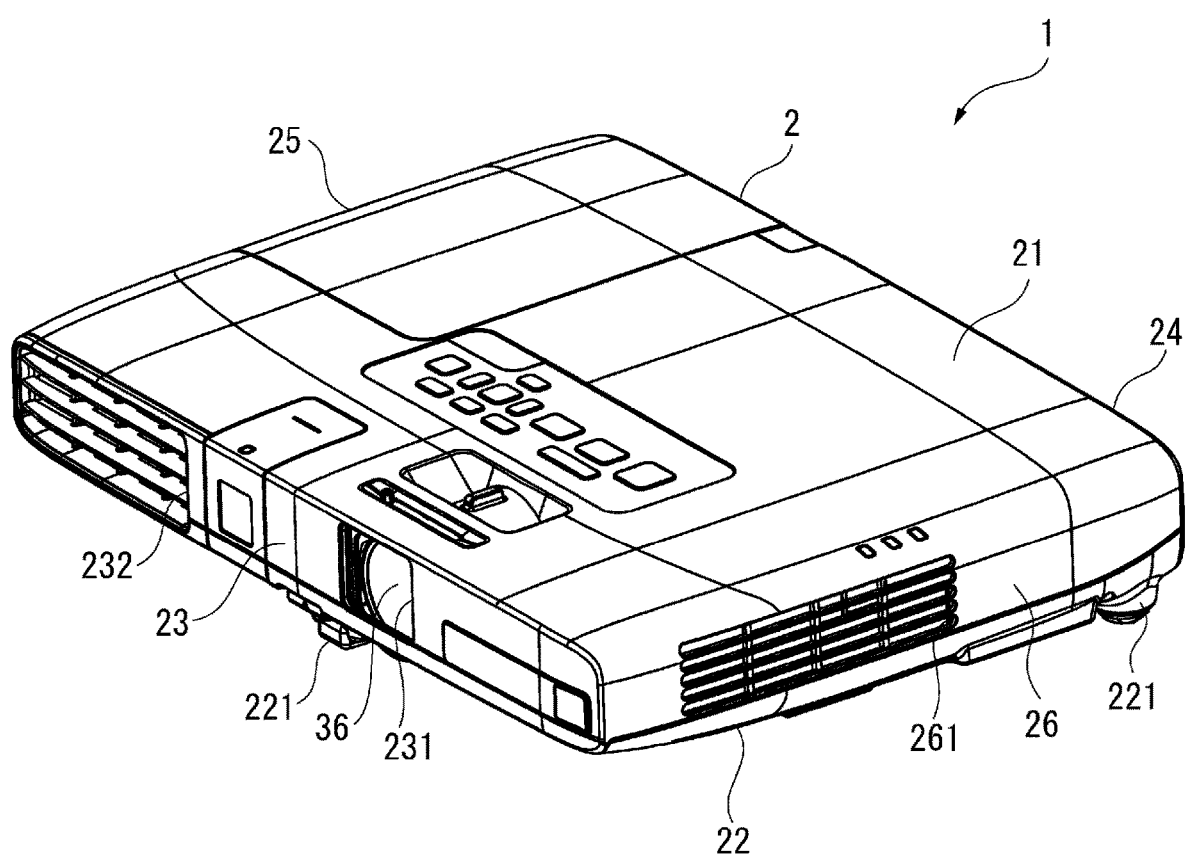
FIG. 1 is a perspective view showing the appearance of a projector according to a first embodiment of the present disclosure.

FIG. 1 is a perspective view showing the appearance of the projector 1 according to the present embodiment.

The projector 1 according to the present embodiment is an image display device for modulating the light emitted from a light source device 4 described later to form an image corresponding to image information, and then projecting the image thus formed on a projection target surface such as a screen in an enlarged manner. As shown in FIG. 1, the projector 1 is provided with an exterior housing 2 constituting the exterior of the projector 1.

Configuration of Exterior Housing

An exterior housing 2 has a top surface part 21, a bottom surface part 22, a front surface part 23, a back surface part 24, a left side surface part 25 and a right side surface part 26, and is formed to have a substantially rectangular solid shape.

The bottom surface part 22 has a plurality of leg parts 22 having contact with an installation surface on which the projector 1 is mounted.

The front surface part 23 is located on the projection side of an image in the exterior housing 2. The front surface part 23 has an opening part 231 for exposing a part of a projection optical device 36 described later, and the image to be projected by the projection optical device 36 passes through the opening part 231. Further, the front surface part 23 has an exhaust port 232 from which a cooling gas having cooled the cooling target in the projector 1 is discharged to the outside of the exterior housing 2.

The right side surface part 26 has an introduction port 261 from which a gas such as air located outside the exterior housing 2 is introduced inside as a cooling gas.

Internal Configuration of Projector

Figure 2:
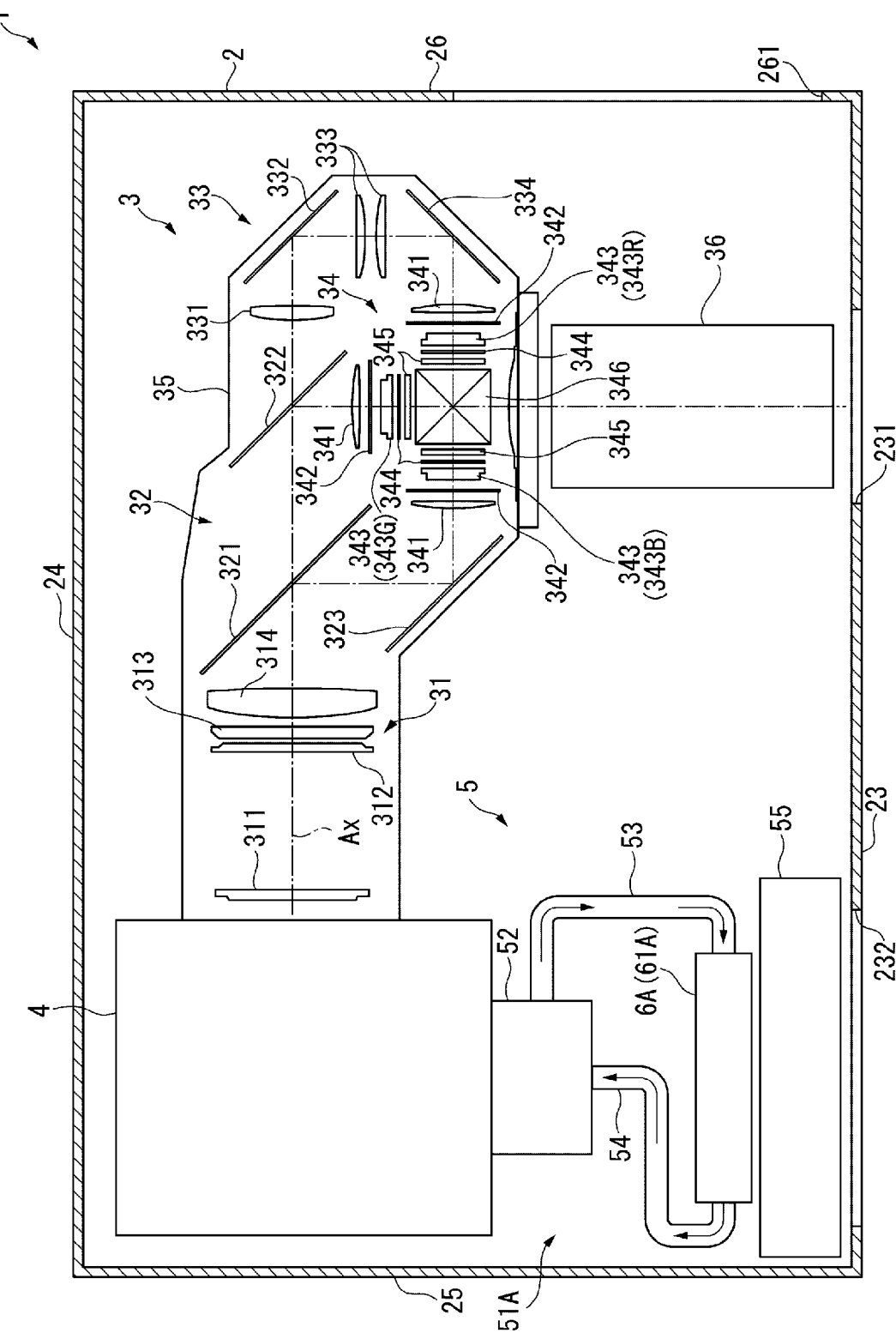
FIG. 2 is a schematic diagram showing an internal configuration of the projector according to the first embodiment.

FIG. 2 is a schematic diagram showing an internal configuration of the projector 1.

As shown in FIG. 2, the projector 1 is further provided with an image projection device 3 and a cooling device 5 each housed inside the exterior housing 2. Besides the above, although not shown in the drawings, the projector 1 is provided with a control device for controlling an operation of the projector 1, and a power supply device for supplying electronic components of the projector 1 with electrical power.

Configuration of Image Projection Device

The image projection device 3 forms and then projects the image corresponding to the image information input from the control device. The image projection device 3 is provided with a light source device 4, a homogenizing device 31, a color separation device 32, a relay device 33, an image forming device 34, an optical component housing 35 and a projection optical device 36.

The light source device 4 emits illumination light. A configuration of the light source device 4 will be described later in detail.

The homogenizing device 31 homogenizes the illumination light emitted from the light source device 4. The illumination light thus homogenized illuminates a modulation area of a light modulator 343 described later of the image forming device 34 via the color separation device 32 and the relay device 33. The homogenizing device 31 is provided with two lens arrays 311, 312, a polarization conversion element 313 and a superimposing lens 314.

The color separation device 32 separates the light having entered the color separation device 32 from the homogenizing device 31 into colored light beams of red, green and blue. The color separation device 32 is provided with two dichroic mirrors 321, 322, and a reflecting mirror 323 for reflecting the blue light beam having been separated by the dichroic mirror 321.

The relay device 33 is disposed on a light path of the red light beam longer than light paths of other colored light beams to suppress a loss of the red light beam. The relay device 33 is provided with an incident side lens 331, a relay lens 333 and reflecting mirrors 332, 334. It should be noted that in the present embodiment, it is assumed that the colored light beam longer in light path than other colored light beams is the red light beam, and the relay device 33 is disposed on the light path of the red light beam. However, this is not a limitation, and it is also possible to adopt a configuration in which, for example, the colored light beam longer in light path than other colored light beams is the blue light beam and the relay device 33 is disposed on the light path of the blue light beam.

The image forming device 34 modulates each of the colored light beams of red, green and blue having entered the image forming device 34, and combines the colored light beams thus modulated with each other to form the image. The image forming device 34 is provided with three field lenses 341, three incident side polarization plates 342, three light modulators 343, three view angle compensation plates 344 and three exit side polarization plates 345 each disposed in accordance with the respective colored light beams entering the image forming device 34, and a single color combining device 346.

The light modulators 343 each modulate the light emitted from the light source device 4 in accordance with the image information. The light modulators 343 include the light modulator 343R for the red light beam, the light modulator 343G for the green light beam, and the light modulator 343B for the blue light beam. In the present embodiment, the light modulators 343 are each formed of a transmissive liquid crystal panel, and the incident side polarization plate 342, the light modulator 343 and the exit side polarization plate 345 constitute a liquid crystal light valve.

The color combining device 346 combines the colored light beams modulated by the light modulators 343B, 343G and 343R with each other to form the image. In the present embodiment, the color combining device 346 is formed of a cross dichroic prism, but this is not a limitation, and it is also possible for the color combining device 346 to be formed of a plurality of dichroic mirrors.

The optical component housing 35 houses the devices 31 through 34 described above inside. It should be noted that an illumination light axis Ax as a design optical axis is set to the image projection device 3, and the optical component housing 35 holds the devices 31 through 34 at predetermined positions on the illumination light axis Ax. It should be noted that the light source device 4 and the projection optical device 36 are disposed at predetermined positions on the illumination light axis Ax.

The projection optical device 36 projects the image entering the projection optical device 36 from the image forming device 34 on the projection target surface in an enlarged manner. In other words, the projection optical device 36 projects the light beams having respectively been modulated by the light modulators 343B, 343G and 343R. The projection optical device 36 is configured as a combination lens composed of a plurality of lenses housed in a lens tube having a cylindrical shape, for example.

Configuration of Light Source Device

Figure 3:
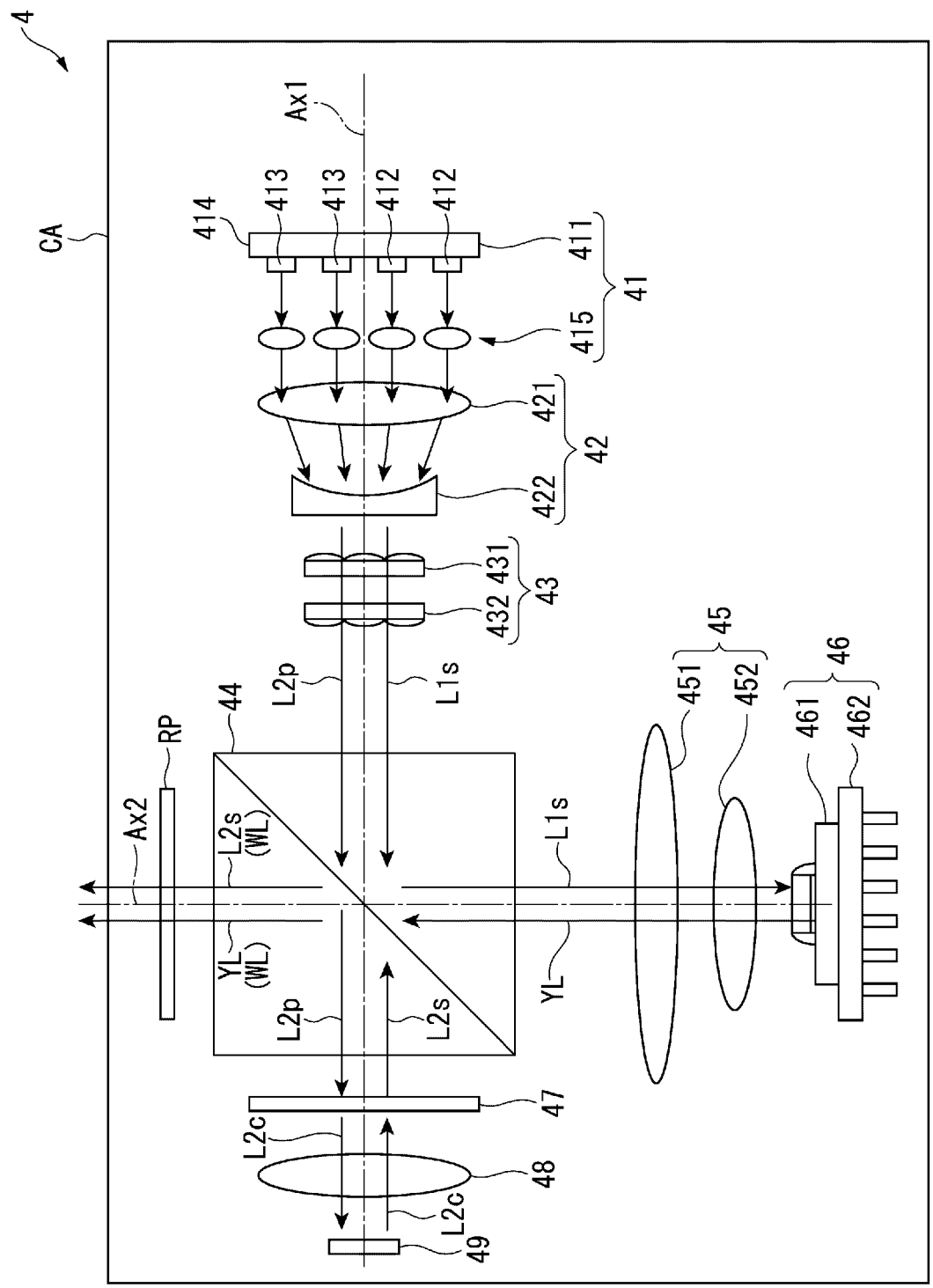
FIG. 3 is a schematic diagram showing a configuration of a light source device in the first embodiment.

FIG. 3 is a schematic diagram showing a configuration of the light source device 4.

The light source device 4 emits the illumination light to the homogenizing device 31. As shown in FIG. 3, the light source device 4 is provided with a light source unit 41, an afocal optical element 42, a homogenizer optical element 43, a polarization split element 44, a first light collection element 45, a wavelength conversion element 46, a first retardation element 47, a second light collection element 48, a diffusely reflecting device 49 and a second retardation element RP, and a light source housing CA for housing these constituents inside.

The light source housing CA is configured as a sealed housing difficult for dust or the like to enter the inside thereof.

The light source unit 41, the afocal optical element 42, the homogenizer optical element 43, the polarization split element 44, the first retardation element 47, the second light collection element 48 and the diffusely reflecting device 49 are arranged on an illumination light axis Ax1 set in the light source device 4.

The wavelength conversion element 46, the first light collection element 45, the polarization split element 44 and the second retardation element RP are set in the light source device 4, and are arranged on an illumination light axis Ax2 perpendicular to the illumination light axis Ax1.

Configuration of Light Source Unit

The light source unit 41 is provided with a light source 411 for emitting the light, and a collimator lens 415.

The light source 411 is provided with a plurality of first semiconductor lasers 412 and a plurality of second semiconductor lasers 413, and a support member 414.

The first semiconductor lasers 412 each emit blue light L1s, which is s-polarized light, as excitation light. The blue light L1s is, for example, a laser beam with a peak wavelength of 440 nm. The blue light L1s having been emitted from the first semiconductor lasers 412 enters the wavelength conversion element 46.

The second semiconductor lasers 413 each emit blue light L2p, which is p-polarized light. The blue light L2p is, for example, a laser beam with a peak wavelength of 460 nm. The blue light L2p having been emitted from the second semiconductor lasers 413 enters the diffusely reflecting device 49.

The support member 414 supports the plurality of first semiconductor lasers 412 and the plurality of second semiconductor lasers 413 each arranged in an array in a plane perpendicular to the illumination light axis Ax1. The support member 414 is a metal member having thermal conductivity, and is connected to an evaporator 52 described later, and the heat of each of the semiconductor lasers 412, 413, namely the light source 411, as the heat source is transferred to the evaporator 52.

The blue light L1s having been emitted from the first semiconductor lasers 412 and the blue light L2p having been emitted from the second semiconductor lasers 413 are converted by the collimator lens 415 into a parallel light beam, and then enter the afocal optical element 42.

It should be noted that in the present embodiment, the light source 411 has a configuration of emitting the blue light L1s as the s-polarized light and the blue light L2p as the p-polarized light. However, this is not a limitation, and the light source 411 can also be provided with a configuration of emitting a blue light beam which is a linearly polarized light beam the same in polarization direction. In this case, it is sufficient to dispose a retardation element, which changes one type of linearly polarized light having entered the retardation element to light including s-polarized light and p-polarized light, between the light source unit 41 and the polarization split element 44.

Configuration of Afocal Optical Element and Homogenizer Optical Element

The afocal optical element 42 adjusts the beam diameter of the blue light L1s, L2p which enters the afocal optical element 42 from the light source unit 41, and then makes the blue light L1s, L2p enter the homogenizer optical element 43. The afocal optical element 42 is constituted by a lens 421 for collecting the incident light, and a lens 422 for collimating the light beam collected by the lens 421.

The homogenizer optical element 43 homogenizes the illuminance distribution of the blue light L1s, L2p. The homogenizer optical element 43 is formed of a pair of multi-lens arrays 431, 432.

Configuration of Polarization Split Element

The blue light L1s, L2p having been transmitted through the homogenizer optical element 43 enters the polarization split element 44.

The polarization split element 44 is a prism-type polarization beam splitter, and separates an s-polarization component and a p-polarization component included in the incident light from each other. Specifically, the polarization split element 44 reflects the s-polarization component, and transmits the p-polarization component. Further, the polarization split element 44 has a color separation characteristic of transmitting light with the wavelength no shorter than a predetermined wavelength irrespective of whether the light is the s-polarization component or the p-polarization component. Therefore, the blue light L1s as the s-polarized light is reflected by the polarization split element 44, and enters the first light collection element 45. Meanwhile, the blue light L2p as the p-polarized light is transmitted through the polarization split element 44, and enters the first retardation element 47.

Configuration of First Light Collection Element

The first light collection element 45 converges the blue light L1s having been reflected by the polarization split element 44 on the wavelength conversion element 46. Further, the first light collection element 45 collimates fluorescence YL entering the first light collection element 45 from the wavelength conversion element 46. Although the first light collection element 45 is constituted by two lenses 451, 452 in the example shown in FIG. 3, the number of lenses constituting the first light collection element 45 does not matter.

Configuration of Wavelength Conversion Element

The wavelength conversion element 46 is excited by the incident light to generate the fluorescence YL longer in wavelength than the incident light, and emits the fluorescence YL to the first light collection element 45. In other words, the wavelength conversion element 46 converts the wavelength of the incident light, and emits the light thus converted. The fluorescence YL generated by the wavelength conversion element 46 is, for example, light with the peak wavelength in a range of 500 through 700 nm. The wavelength conversion element 46 is provided with a wavelength converter 461 and a heat radiator 462.

Although not shown in the drawings, the wavelength converter 461 has a wavelength conversion layer and a reflecting layer. The wavelength conversion layer includes a phosphor for diffusely emitting the fluorescence YL as non-polarized light obtained by performing the wavelength conversion on the incident blue light L1s. The reflecting layer reflects the fluorescence YL entering the reflecting layer from the wavelength conversion layer toward the first light collection element 45.

The heat radiator 462 is disposed on a surface on an opposite side to the incident side of light in the wavelength converter 461 to radiate the heat generated in the wavelength converter 461.

The fluorescence YL having been emitted from the wavelength conversion element 46 passes through the first light collection element 45 along the illumination light axis Ax2, and then enters the polarization split element 44 having the color separation characteristic described above. Then, the fluorescence YL passes through the polarization split element 44 along the illumination light axis Ax2, and then enters the second retardation element RP.

It should be noted that the wavelength conversion element 46 can also be provided with a configuration of being rotated around a rotational axis parallel to the illumination light axis Ax2 by a rotation device such as a motor.

Configuration of First Retardation Element and Second Light Collection Element

The first retardation element 47 is disposed between the polarization split element 44 and the second light collection element 48. The first retardation element 47 converts the blue light L2p having passed through the polarization split element 44 into blue light L2c as circularly polarized light. The blue light L2c enters the second light collection element 48.

The second light collection element 48 converges the blue light L2c entering the second light collection element 48 from the first retardation element 47 on the diffusely reflecting device 49. Further, the second light collection element 48 collimates the blue light L2c entering the second light collection element 48 from the diffusely reflecting device 49. It should be noted that the number of lenses constituting the second light collection element 48 can arbitrarily be changed.

Configuration of Diffusely Reflecting Device

The diffusely reflecting device 49 diffusely reflects the incident blue light L2c at substantially the same diffusion angle as that of the fluorescence YL generated in and emitted from the wavelength conversion element 46. As a configuration of the diffusely reflecting device 49, there can be illustrated a configuration provided with a reflecting plate for performing Lambertian reflection on the incident blue light L2c and a rotation device for rotating the reflecting plate around a rotational axis parallel to the illumination light axis Ax1.

The blue light L2c having diffusely been reflected by the diffusely reflecting device 49 passes through the second light collection element 48, and then enters the first retardation element 47. The blue light L2c is converted into circularly polarized light with the opposite rotational direction when reflected by the diffusely reflecting device 49. Therefore, the blue light L2c having entered the first retardation element 47 via the second light collection element 48 is not converted into the blue light L2p as the p-polarized light at the moment when having entered the first retardation element 47 from the polarization split element 44, but is converted into the blue light L2s as the s-polarized light. Then, the blue light L2s is reflected by the polarization split element 44 to enter the second retardation element RP. Therefore, the light which enters the second retardation element RP from the polarization split element 44 is white light having the blue light L2s and the fluorescence YL mixed with each other.

Configuration of Second Retardation Element

The second retardation element RP converts the white light entering the second retardation element RP from the polarization split element 44 into light having s-polarized light and p-polarized light mixed with each other. The illumination light WL as the white light converted in such a manner enters the homogenizing device 31 described above.

Configuration of Cooling Device

The cooling device 5 cools a cooling target constituting the projector 1. In the present embodiment, the cooling target is the light source 411 of the light source device 4. As shown in FIG. 2, the cooling device 5 is provided with a loop heat pipe 51A and a cooling fan 55.

The cooling fan 55 is disposed between the exhaust port 232 and a condenser 6A described later of the loop heat pipe 51A in the space inside the exterior housing 2. The cooling fan 55 makes cooling air flow through the condenser 6A in the process of suctioning the cooling air inside the exterior housing 2 to discharge the cooling air from the exhaust port 232, and thus, cools the condenser 6A. It should be noted that it is also possible to adopt a configuration in which, for example, the cooling fan 55 is disposed between the introduction port 261 and the condenser 6A described later in the space inside the exterior housing 2, and suctions the cooling air located outside the exterior housing 2 to feed the cooling air to the condenser 6A.

The loop heat pipe 51A has a circulation channel for circulating the working fluid, which is encapsulated in a reduced pressure state to thereby be changed in phase state at a relatively low temperature. In the detailed description, the loop heat pipe 51A causes the phase change of the phase state of the working fluid encapsulated inside in the reduced pressure state from the liquid phase to the vapor phase due to the heat transferred from the cooling target to draw the heat from the working fluid in the vapor phase with a region other than regions where the phase change of the working fluid from the liquid phase to the vapor phase has occurred to thereby change the phase state of the working fluid from the vapor phase to the liquid phase, and at the same time, radiates the heat thus drawn to thereby cool the cooling target.

Such a loop heat pipe 51A is provided with the evaporator 52, a vapor pipe 53, the condenser 6A and a liquid pipe 54.

Configuration of Vapor Pipe and Liquid Pipe

Firstly, the vapor pipe 53 and the liquid pipe 54 will be described.

The vapor pipe 53 is a tubular member for connecting the evaporator 52 and the condenser 6A to each other in the circulation channel of the working fluid so that the working fluid in the vapor phase can flow. The vapor pipe 53 makes the working fluid, which has changed to the vapor phase in the evaporator 52 and then flows from the evaporator 52 into the vapor pipe 53, flow into the condenser 6A.

The liquid pipe 54 is a tubular member for connecting the condenser 6A and the evaporator 52 to each other in the circulation channel of the working fluid so that the working fluid in the liquid phase can flow. The liquid pipe 54 makes the working fluid having changed to the liquid phase in the condenser 6A flow into the evaporator 52.

Configuration of Evaporator

Figure 4:
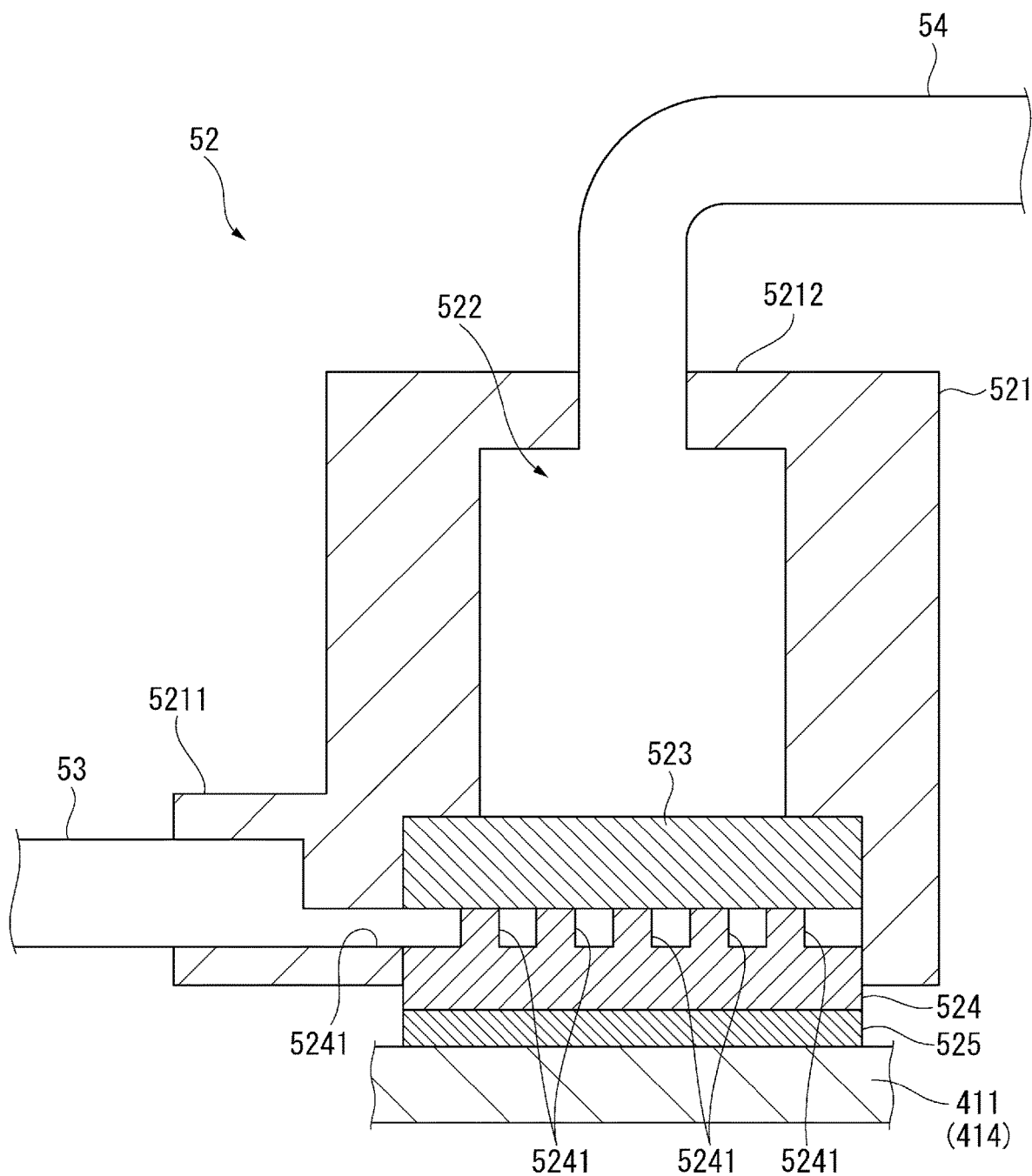
FIG. 4 is a cross-sectional view showing an internal configuration of an evaporator in the first embodiment.

FIG. 4 is a cross-sectional view showing an internal configuration of the evaporator 52.

As shown in FIG. 2, the evaporator 52 is an evaporator which is connected to the light source 411 as the cooling target, and evaporates the working fluid in the liquid phase flowing inside due to the heat transferred from the light source 411 to be changed to the working fluid in the vapor phase. Specifically, the evaporator 52 is connected to the support member 414 of the light source 411, and evaporates the working fluid in the liquid phase with the heat of the semiconductor lasers 412, 413 transferred via the support member 414 to thereby cool the semiconductor lasers 412, 413 constituting the light source 411.

As shown in FIG. 4, the evaporator 52 is provided with a housing 521, a reservoir 522 disposed inside the housing 521, a wick 523, a groove member 524 and a heat receiving member 525.

The housing 521 is a housing made of metal, and has a connector 5211 to which the vapor pipe 53 is connected, and a connector 5212 which is located on the opposite side to the connector 5211, and to which the liquid pipe 54 is connected. Besides the above, the housing 521 has a space formed inside by being combined with the groove member 524. This space is communicated with the vapor pipe 53 via the connector 5211, and further communicated with the liquid pipe 54 via the connector 5212 to form the reservoir 522 for storing the working fluid in the liquid phase. The working fluid in the liquid phase flows from the liquid pipe 54 into the reservoir 522.

The reservoir 522 is disposed inside the housing 521 to store the working fluid in the liquid phase flowing into the housing 521 via the liquid pipe 54. In other words, the reservoir 522 is a region in which the working fluid in the liquid phase having failed to be suctioned by the wick 523 is stored in the housing 521.

The wick 523 is a plate-like porous body which is disposed inside the housing 521, and into which the working fluid in the liquid phase soaks. The wick 523 transports the working fluid in the liquid phase stored in the reservoir 522 toward the groove member 524 due to a capillary force. The wick 523 is formed of a metal fiber made of, for example, copper or stainless steel, or a material such as glass.

The groove member 524 is formed of metal having thermal conductivity. The groove member 524 is provided to the housing 521, and is connected to the wick 523. The groove member 524 evaporates the working fluid in the liquid phase having been transported by the wick 523 with the heat transferred from the cooling target via the heat receiving member 525, namely the heat transferred from the light source 411 via the support member 414 and the heat receiving member 525. The groove member 524 has a plurality of vapor flow channels 5241 through which the working fluid having changed from the liquid phase to the vapor phase flows.

It should be noted that although the detailed illustration is omitted in FIG. 4, the plurality of vapor flow channels 5241 extends in a direction perpendicular to the sheet of FIG. 4, and an end of each of the vapor flow channels 5241 and the vapor pipe 53 are communicated with each other. Therefore, the working fluid having been changed from the liquid phase to the vapor phase flows out to the vapor pipe 53 through the plurality of vapor flow channels 5241.

The heat receiving member 525 is connected to the support member 414 of the light source 411 as the cooling target of the loop heat pipe 51A to transfer the heat generated in the semiconductor lasers 412, 413 to the groove member 524. In other words, in the evaporator 52, the heat of the cooling target as the heat source is transferred to the groove member 524 via the heat receiving member 525.

Here, when the thermal conductivity of the wick 523 is relatively high, the heat having been transferred to the groove member 524 is transferred to the wick 523. Therefore, the working fluid in the liquid phase having been transported evaporates inside the wick 523.

In contrast, when the thermal conductivity of the wick 523 is relatively low, the heat having been transferred to the groove member 524 is hard to be transferred to the wick 523. Thus, the working fluid in the liquid phase having been transported by the wick 523 flows to the groove member 524, and then evaporates on a surface of the groove member 524.

As described above, due to the heat transferred from the cooling target, the working fluid changes in phase state from the liquid phase to the vapor phase in at least either one of a region inside the wick 523 and a region in the surface of the groove member 524. The working fluid having changed in phase state to the vapor phase flows through the plurality of vapor flow channels 5241 into the vapor pipe 53, and then reaches the condenser 6A via the vapor pipe 53 due to the pressure.

Configuration of Condenser

The condenser 6A draws the heat of the working fluid in the vapor phase flowing via the vapor pipe 53 to thereby radiate the heat thereof, and thus, changes the working fluid in phase from the vapor phase to the liquid phase, and then makes the working fluid in the liquid phase flow out to the liquid pipe 54. In other words, the condenser 6A condenses the working fluid in the vapor phase to change the working fluid in the vapor phase to the working fluid in the liquid phase. The condenser 6A has a main body part 61A to which the vapor pipe 53 and the liquid pipe 54 are connected, and a heat radiator not shown connected to the main body part 61A.

It should be noted that the heat radiator is a member for radiating the heat of the working fluid having been transferred to the main body part 61A, and is a so-called heatsink. Through the heat radiator, the cooling gas flows due to the drive of the cooling fan 55, and thus, the heat radiator, by extension the condenser 6A, is cooled.

Figure 5:
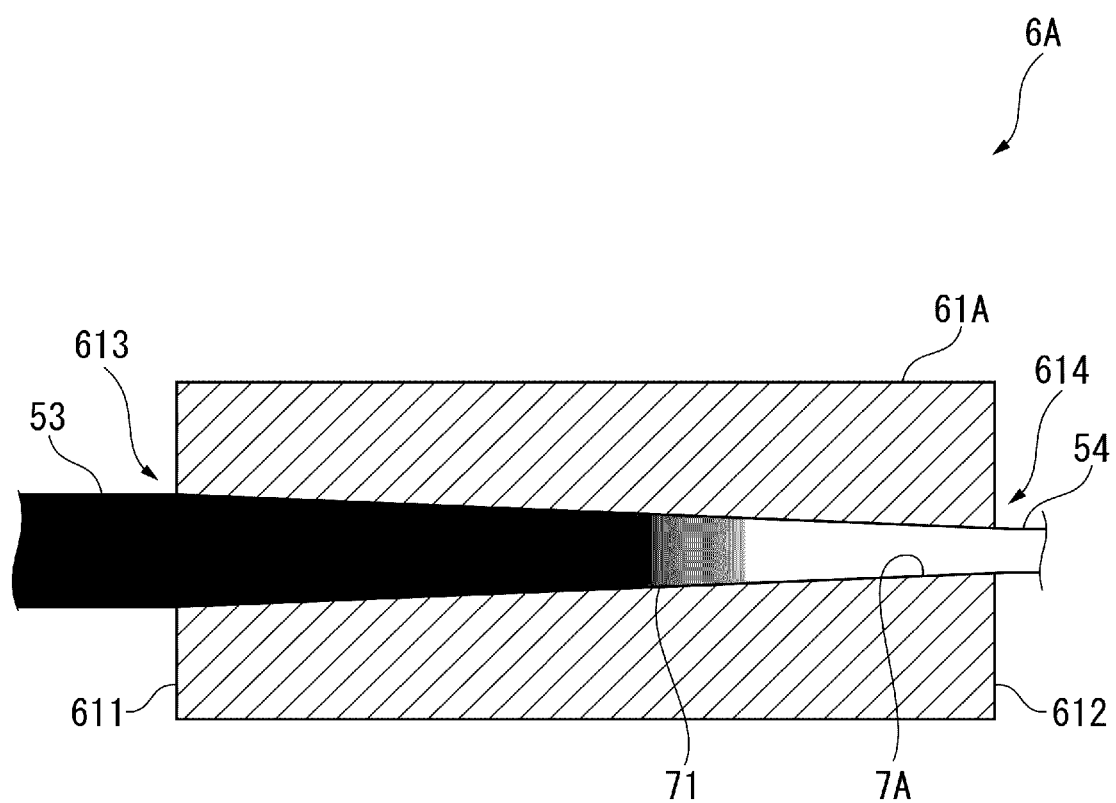
FIG. 5 is a cross-sectional view showing an internal configuration of a condenser in the first embodiment.

FIG. 5 is a cross-sectional view showing an internal configuration of the condenser 6A.

As shown in FIG. 5, the main body part 61A has a vapor pipe connector 613 and a liquid pipe connector 614 wherein the vapor pipe connector 613 is disposed in one end part 611, and the vapor pipe 53 is connected to the vapor pipe connector 613, and the liquid pipe connector 614 is disposed in the other end part 612 located on the opposite side with respect to the one end part 611, and the liquid pipe 54 is connected to the liquid pipe connector 614. Besides the above, the main body part 61A is communicated with the vapor pipe 53 via the vapor pipe connector 613, and is further communicated with the liquid pipe 54 via the liquid pipe connector 614, and incorporates one phase change flow channel 7A through which the working fluid flows.

The phase change flow channel 7A extends in a single direction from the vapor pipe connector 613 toward the liquid pipe connector 614. In the process in which the working fluid in the vapor phase inflowing from the vapor pipe 53 flows toward the liquid pipe 54, the phase change flow channel 7A draws the heat from the working fluid in the vapor phase to thereby change the working fluid in phase from the working fluid in the vapor phase to the working fluid in the liquid phase. In other words, the working fluid in the vapor phase flows into the phase change flow channel 7A via the vapor pipe 53, and the working fluid having been changed in phase from the vapor phase to the liquid phase is made to flow out to the liquid pipe 54 by the phase change flow channel 7A.

The phase change flow channel 7A has a reduced diameter part 71 relatively large in flow channel cross-sectional area of an upstream region in the flowing direction of the working fluid, and relatively small in flow channel cross-sectional area of a downstream region. In other words, the reduced diameter part 71 decreases in flow channel cross-sectional area from upstream toward downstream of the working fluid. The reduced diameter part 71 is a region of decreasing the flow channel cross-sectional area of the phase change flow channel 7A in accordance with the change in phase state of the working fluid from the vapor phase large in volume to the liquid phase small in volume. In the present embodiment, the whole of the phase change flow channel 7A forms the reduced diameter part 71, the phase change flow channel 7A is formed so that the flow channel cross-sectional area decreases toward the downstream throughout an area from a region on the end part 611 side which is the upstream to a region on the end part 612 side which is the downstream in the flowing direction of the working fluid in the phase change flow channel 7A.

Since such a reduced diameter part 71 is provided to the phase change flow channel 7A, it is possible to prevent the pressure loss from occurring in the phase change flow channel 7A, by extension, in the loop heat pipe 51A, due to the volume change when the working fluid in the vapor phase changes to the working fluid in the liquid phase. Further, when the working fluid which has condensed in the condenser 6A to be changed in phase from the vapor phase to the liquid phase flows downstream through the reduced diameter part 71 small in flow channel cross-sectional area, the capillary force toward the liquid pipe 54 acts on the working fluid having changed in phase to the liquid phase. Therefore, it is possible to promptly discharge the working fluid in the liquid phase to the liquid pipe 54, and thus, it is possible to make the working fluid in the liquid phase promptly flow into the evaporator 52 via the liquid pipe 54.

Advantages of First Embodiment

The projector 1 according to the present embodiment described hereinabove has the following advantages.

The cooling device 5 is provided with the loop heat pipe 51A. The loop heat pipe 51A is provided with the evaporator 52, the condenser 6A, the vapor pipe 53 and the liquid pipe 54, wherein the evaporator 52 evaporates the working fluid in the liquid phase due to the heat transferred from the light source 411 as the cooling target to thereby change to the working fluid in the vapor phase, the condenser 6A condenses the working fluid in the vapor phase to thereby change to the working fluid in the liquid phase, the vapor pipe 53 makes the working fluid having changed in the evaporator 52 to one in the vapor phase flow into the condenser 6A, and the liquid pipe 54 makes the working fluid having changed in the condenser 6A to one in the liquid phase flow into the evaporator 52. Further, the condenser 6A has the phase change flow channel 7A into which the working fluid in the vapor phase flows via the vapor pipe 53, and from which the working fluid having changed in phase from the vapor phase to the liquid phase flows to the liquid pipe 54, and the phase change flow channel 7A has the reduced diameter part 71 having the flow channel cross-sectional area decreasing in the direction from the upstream toward the downstream of the working fluid.

According to this configuration, since it is possible to decrease the flow channel cross-sectional area in accordance with the volume change due to the change in phase state of the working fluid flowing into the condenser 6A due to the reduced diameter part 71 provided to the phase change flow channel 7A, it is possible to prevent the pressure loss from occurring in the phase change flow channel 7A. Therefore, since it is possible to promptly discharge the working fluid having changed in phase from the vapor phase to the liquid phase from the condenser 6A to the liquid pipe 54, it is possible to efficiently perform the heat exchange from the working fluid to the main body part 61A. Therefore, it is possible to enhance the cooling efficiency of the working fluid, and by extension, it is possible to enhance the cooling efficiency of the light source 411 as the cooling target transferring the heat to the evaporator 52.

Further, the phase change flow channel 7A extends in one direction from the vapor pipe connector 613 disposed in the end part 611 toward the liquid pipe connector 614 disposed in the end part 612 on the opposite side to the end part 611. Thus, the phase change flow channel 7A becomes a flow channel having no folding-back part. It should be noted that the folding-back part is a region where the direction in which the phase change flow channel extends is reversed between the vapor pipe connector and the liquid pipe connector inside the condenser in the phase change flow channel. For example, as the folding-back part, there can be cited a substantially U-shape part for changing the flowing direction of the working fluid from the folding-back part to an opposite direction to the flowing direction of the working fluid to the folding-back part. Further, the phase change flow channel having the folding-back part is, for example, a meandering flow channel.

As described above, since the phase change flow channel 7A does not have the folding-back part, it is possible to prevent that the heat having been transferred to the main body part 61A in the inflow region of the working fluid to the phase change flow channel 7A is transferred again to the working fluid flowing after being folded back in the folding-back part and thus the working fluid is heated to thereby locally increase the internal pressure of the phase change flow channel 7A. In other words, since the phase change flow channel 7A does not have the folding-back part, but extends in one direction from the vapor pipe connector 613 toward the liquid pipe connector 614, it is possible to decrease the temperature and the pressure in a direction from the end part 611 toward the end part 612. Therefore, it is possible to prevent the pressure loss from occurring in the phase change flow channel 7A, and thus, it is possible to efficiently cool the working fluid.

The projector 1 is provided with the light source device 4 having the light source 411, the light modulators 343, the projection optical device 36 and the cooling device 5 described above. Further, the support member 414 constituting the light source 411 is connected to the heat receiving member 525 of the evaporator 52, and the heat of the semiconductor lasers 412, 413 also constituting the light source 411 is transferred to the heat receiving member 525 via the support member 414. In other words, the cooling target of the cooling device 5 is the light source 411. According to this configuration, the heat of the light source 411 can be radiated in the condenser 6A. Therefore, it is possible to cool the light source 411.

Second Embodiment

Then, a second embodiment of the present disclosure will be described.

A projector according to the present embodiment has substantially the same configuration as the projector 1 described in the first embodiment, but is different from the projector 1 in the point that the configuration of the phase change flow channel of the condenser is different. It should be noted that in the following description, a part which is the same or substantially the same as the part having already been described is denoted by the same reference symbol, and the description thereof will be omitted.

Figure 6:
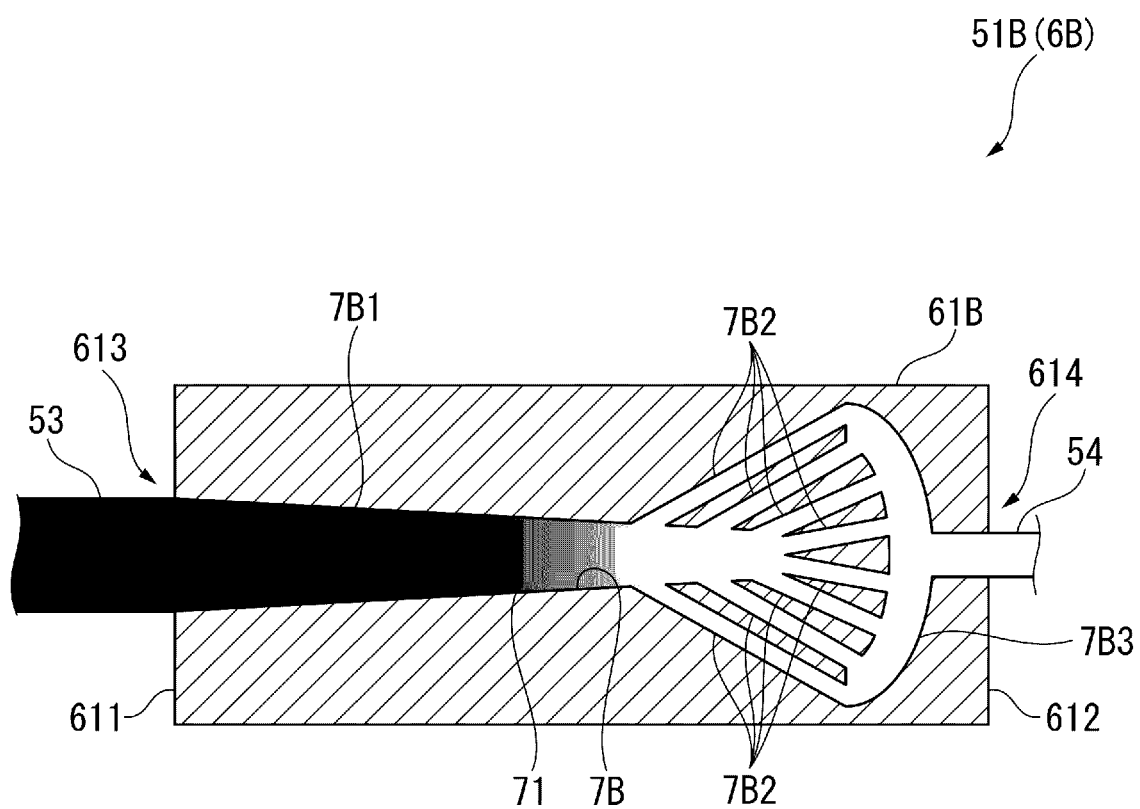
FIG. 6 is a cross-sectional view showing an internal configuration of a condenser of a cooling device provided to a projector according to a second embodiment of the present disclosure.

FIG. 6 is a cross-sectional view showing an internal configuration of a condenser 6B of a cooling device provided to the projector according to the present embodiment.

The projector according to the present embodiment has substantially the same configuration and functions as those of the projector 1 except the point that a loop heat pipe 51B is provided instead of the loop heat pipe 51A. In other words, the cooling device 5 provided to the projector according to the present embodiment is provided with the loop heat pipe 51B and the cooling fan 55. The loop heat pipe 51B has the evaporator 52, the vapor pipe 53, the condenser 6B and the liquid pipe 54, and functions similarly to the loop heat pipe 51A.

As shown in FIG. 6, the condenser 6B is provided with a main body part 61B to be connected to the vapor pipe 53 and the liquid pipe 54, and the heat radiator not shown.

Similarly to the main body part 61A, the main body part 61B has the one end part 611 and the other end part 612, the vapor pipe connector 613 and the liquid pipe connector 614, and a single phase change flow channel 7B formed inside.

The phase change flow channel 7B is communicated with the vapor pipe 53 via the vapor pipe connector 613, and is communicated with the liquid pipe 54 via the liquid pipe connector 614, and functions similarly to the phase change flow channel 7A. The phase change flow channel 7B has a first flow channel 7B1, a plurality of second flow channels 7B2 and a third flow channel 7B3, wherein the first flow channel 7B1 is an upstream area in the phase change flow channel 7B, the working fluid in the vapor phase inflowing from the vapor pipe 53 flows through the first flow channel 7B1, the plurality of second flow channels 7B2 is branched from the first flow channel 7B1, and the plurality of second flow channels 7B2 join each other in the third flow channel 7B3.

The first flow channel 7B1 is a flow channel located upstream in the phase change flow channel 7B, and formed from the end part 611 on the vapor pipe connector 613 side within a range in which the working fluid in the vapor phase completely changes in phase to the working fluid in the liquid phase. The first flow channel 7B1 has the reduced diameter part 71 having the flow channel cross-sectional area decreasing in the direction from the upstream toward the downstream of the working fluid. In the present embodiment, the whole of the first flow channel 7B1 forms the reduced diameter part 71 similarly to the phase change flow channel 7A.

The plurality of second flow channels 7B2 is branched from the first flow channel 7B1, and the working fluid having changed in the first flow channel 7B1 from the vapor phase to the liquid phase flows through the second flow channels 7B2. Specifically, the second flow channels 7B2 are located downstream of the first flow channel 7B1 so that the working fluid in the liquid phase flows through the second flow channels 7B2.

The flow channel cross-sectional area of each of the second flow channels 7B2 is smaller than the flow channel cross-sectional area of the first flow channel 7B1. The second flow channels 7B2 each extend from the first flow channel 7B1 toward the end part 612. The flow channel cross-sectional area of each of the second flow channels 7B2 is set to a size with which the capillary force capable of transporting the working fluid in the liquid phase to the third flow channel 7B3 is generated. Further, each of the second flow channels 7B2 is connected to the third flow channel 7B3. Such second flow channels 7B2 are the flow channel for increasing the contact area between the working fluid in the liquid phase and the main body part 61B to thereby enhance the cooling effect of the working fluid in the liquid phase.

It should be noted that the phase change flow channel 7B an example of which is shown in FIG. 6 is assumed to have the eight second flow channels 7B2 branched from the first flow channel 7B1. However, this is not a limitation, and the number of the second flow channels 7B2 can arbitrarily be changed as long as the number is no smaller than 2.

The third flow channel 7B3 is communicated with each of the second flow channels 7B2 in one end thereof, and is communicated with the liquid pipe connector 614 in the other end thereof. The third flow channel 7B3 joins the working fluid in the liquid phase having flowed through each of the second flow channels 7B2 to make the working fluid thus joined flow out to the liquid pipe 54 via the liquid pipe connector 614.

In such a condenser 6B, the working fluid in the vapor phase having flowed into the phase change flow channel 7B changes to the working fluid in the liquid phase since the heat of the working fluid in the vapor phase is drawn in the process of flowing through the first flow channel 7B1. Then, since the working fluid in the liquid phase flows after being branched into the plurality of second flow channels 7B2 from the first flow channel 7B1, the heat of the working fluid in the liquid phase is further transferred to the main body part 61B, and thus, the working fluid in the liquid phase is cooled. The working fluid in the liquid phase having flowed through each of the second flow channels 7B2 flows through third flow channel 7B3, and is then made to flow out to the liquid pipe 54 via the liquid pipe connector 614.

Advantages of Second Embodiment

According to the projector related to the present embodiment described hereinabove, in addition to the advantages substantially the same as those of the projector 1 described above, the following advantages can be obtained.

The phase change flow channel 7B provided to the condenser 6B has the first flow channel 7B1 and the plurality of second flow channels 7B2, wherein the working fluid in the vapor phase flowing via the vapor pipe 53 flows through the first flow channel 7B1, and the plurality of second flow channels 7B2 is branched from the first flow channel 7B1, and the flow channel cross-sectional area of each of the second flow channels 7B2 is smaller than the flow channel cross-sectional area of the first flow channel 7B1. According to this configuration, it is possible to increase the contact area between the working fluid in the liquid phase and the main body part 61B of the condenser 6B. Therefore, it is possible to further enhance the cooling efficiency of the working fluid, and by extension, it is possible to further enhance the cooling efficiency of the light source 411 as the cooling target.

Third Embodiment

Then, a third embodiment of the present disclosure will be described.

A projector according to the present embodiment has substantially the same configuration as the projector 1 described in the first embodiment, but is different from the projector 1 in the point that the condenser has two inflow ports into which the working fluid in the vapor phase inflows from the vapor pipe. It should be noted that in the following description, a part which is the same or substantially the same as the part having already been described is denoted by the same reference symbol, and the description thereof will be omitted.

Figure 7:
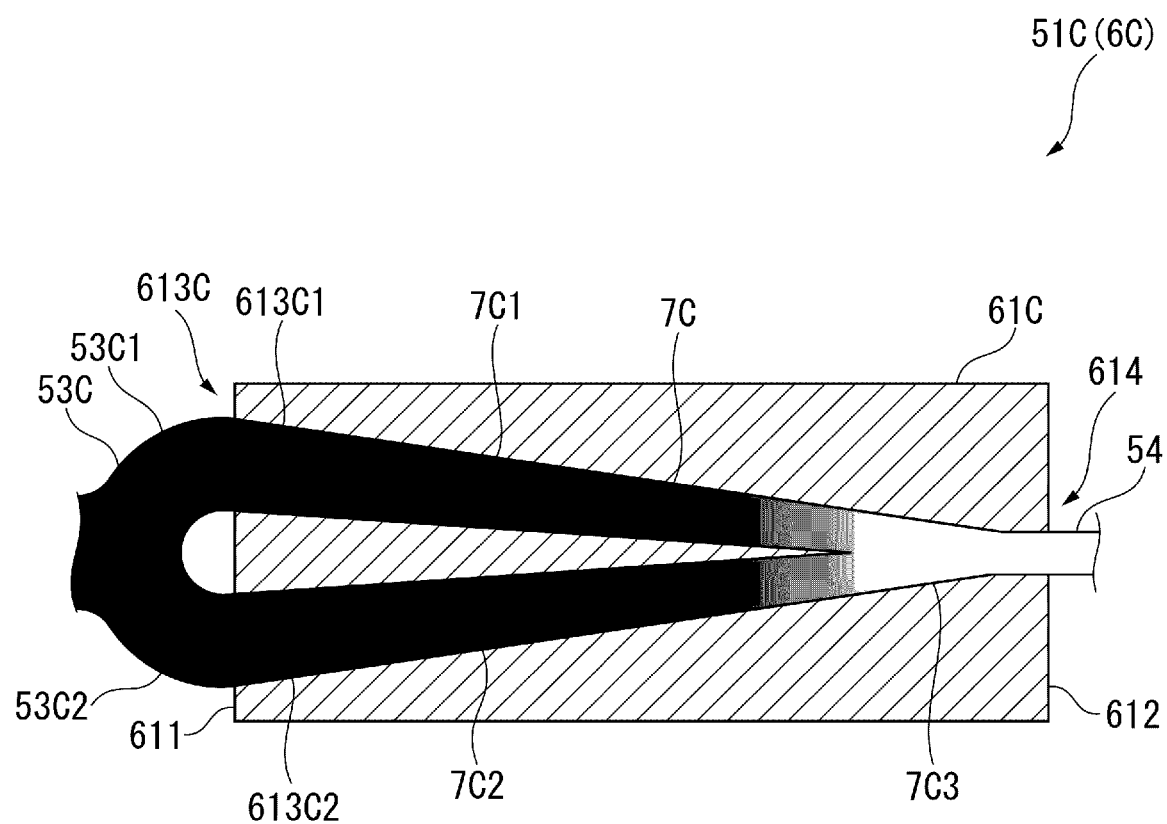
FIG. 7 is a cross-sectional view showing an internal configuration of a condenser of a cooling device provided to a projector according to a third embodiment of the present disclosure.

FIG. 7 is a cross-sectional view showing a condenser 6C of a cooling device provided to the projector according to the present embodiment.

The projector according to the present embodiment has substantially the same configuration and functions as those of the projector 1 except the point that a loop heat pipe 51C is provided instead of the loop heat pipe 51A. In other words, the cooling device 5 provided to the projector according to the present embodiment is provided with the loop heat pipe 51C and the cooling fan 55. The loop heat pipe 51C has the evaporator 52, a vapor pipe 53C, the condenser 6C and the liquid pipe 54, and functions similarly to the loop heat pipe 51A.

Similarly to the vapor pipe 53, the vapor pipe 53C is a tubular member for connecting the evaporator 52 and the condenser 6C to each other to transport the working fluid in the vapor phase generated in the evaporator 52 to the condenser 6C. As shown in FIG. 7, the vapor pipe 53C has a bifurcated end part on the condenser 6C side. Specifically, the vapor pipe 53C has two connectors 53C1, 53C2 in the end part on the condenser 6C side. The connector 53C1 is communicated with an inflow channel 7C1 described later of the condenser 6C, and the connector 53C2 is communicated with an inflow channel 7C2 described later of the condenser 6C.

Similarly to the condenser 6A, the condenser 6C is provided with a main body part 61C to which the vapor pipe 53C and the liquid pipe 54 are connected, and the heat radiator not shown.

The main body part 61C has substantially the same configuration and functions as those of the main body part 61A except the point that a vapor pipe connector 613C and a phase change flow channel 7C are provided instead of the vapor pipe connector 613 and the phase change flow channel 7A.

The vapor pipe connector 613C is located in the end part 611, and is connected to the vapor pipe 53C. The vapor pipe connector 613C has an inflow port 613C1 and an inflow port 613C2, wherein the inflow port 613C1 is connected to the connector 53C1 of the vapor pipe 53C and thus the working fluid in the vapor phase inflows into the inflow port 613C1, the inflow port 613C2 is connected to the connector 53C2 of the vapor pipe 53C and thus the working fluid in the vapor phase inflows into the inflow port 613C2. In other words, the condenser 6C has a plurality of inflow ports 613C1, 613C2 into which the working fluid in the vapor phase inflows.

Similarly to the phase change flow channel 7A, in the process in which the working fluid in the vapor phase inflowing from the vapor pipe 53C flows toward the liquid pipe 54, the phase change flow channel 7C draws the heat from the working fluid in the vapor phase to thereby change the working fluid in phase to the working fluid in the liquid phase. The phase change flow channel 7C is constituted by the two inflow channels 7C1, 7C2, and a junction channel 7C3 where the two inflow channels 7C1, 7C2 join each other. In other words, the phase change flow channel 7C has the plurality of inflow channels 7C1, 7C2, and the junction channel 7C3 where the plurality of inflow channels 7C1, 7C2 joins each other.

The inflow channel 7C1 is communicated with the connector 53C1 via the inflow port 613C1, and the inflow channel 7C2 is communicated with the connector 53C2 via the inflow port 613C2. The inflow channels 7C1, 7C2 are each a flow channel formed from the inflow ports 613C1, 613C2 within a range in which the working fluid in the vapor phase completely changes in phase to the working fluid in the liquid phase similarly to the first flow channel 7B1 described above. Further, the whole of each of the inflow channels 7C1, 7C2 forms the reduced diameter part 71 having the flow channel cross-sectional area decreasing toward the downstream direction.

The junction channel 7C3 is located downstream in the inflow channels 7C1, 7C2, and is communicated with the inflow channels 7C1, 7C2. The working fluid having flowed through the inflow channels 7C1, 7C2 and thus changed from the vapor phase to the liquid phase flows through the junction channel 7C3, and then the junction channel 7C3 makes the working fluid in the liquid phase flow out to the liquid pipe 54 via the liquid pipe connector 614. It should be noted that in the present embodiment, the flow channel cross-sectional area is made substantially constant in a range from the region after the inflow channels 7C1, 7C2 join each other to the liquid pipe 54. However, this is not a limitation, and it is also possible to provide the junction channel 7C3 with the reduced diameter part having the flow channel cross-sectional area decreasing in the direction toward the liquid pipe 54.

Advantages of Third Embodiment

According to the projector related to the present embodiment described hereinabove, in addition to the advantages substantially the same as those of the projector 1 described above, the following advantages can be obtained.

The condenser 6C has a plurality of inflow ports 613C1, 613C2 into which the working fluid in the vapor phase inflows. The phase change flow channel 7C in the condenser 6C has the plurality of inflow channels 7C1, 7C2 communicated respectively with the inflow ports 613C1m 613C2, and the junction channel 7C3 where the plurality of inflow channels 7C1, 7C2 joins each other. According to this configuration, it is possible to increase the contact area between the working fluid in the vapor phase and the main body part 61C of the condenser 6C. Therefore, it is possible to further enhance the cooling efficiency of the working fluid, and by extension, it is possible to further enhance the cooling efficiency of the light source 411 as the cooling target.

Fourth Embodiment

Then, a fourth embodiment of the present disclosure will be described.

A projector according to the present embodiment has substantially the same configuration as the projector described in the third embodiment, but is different from the projector described in the third embodiment in the point that the phase change flow channel of the condenser further includes branched flow channels downstream of the junction channel. It should be noted that in the following description, a part which is the same or substantially the same as the part having already been described is denoted by the same reference symbol, and the description thereof will be omitted.

Figure 8:
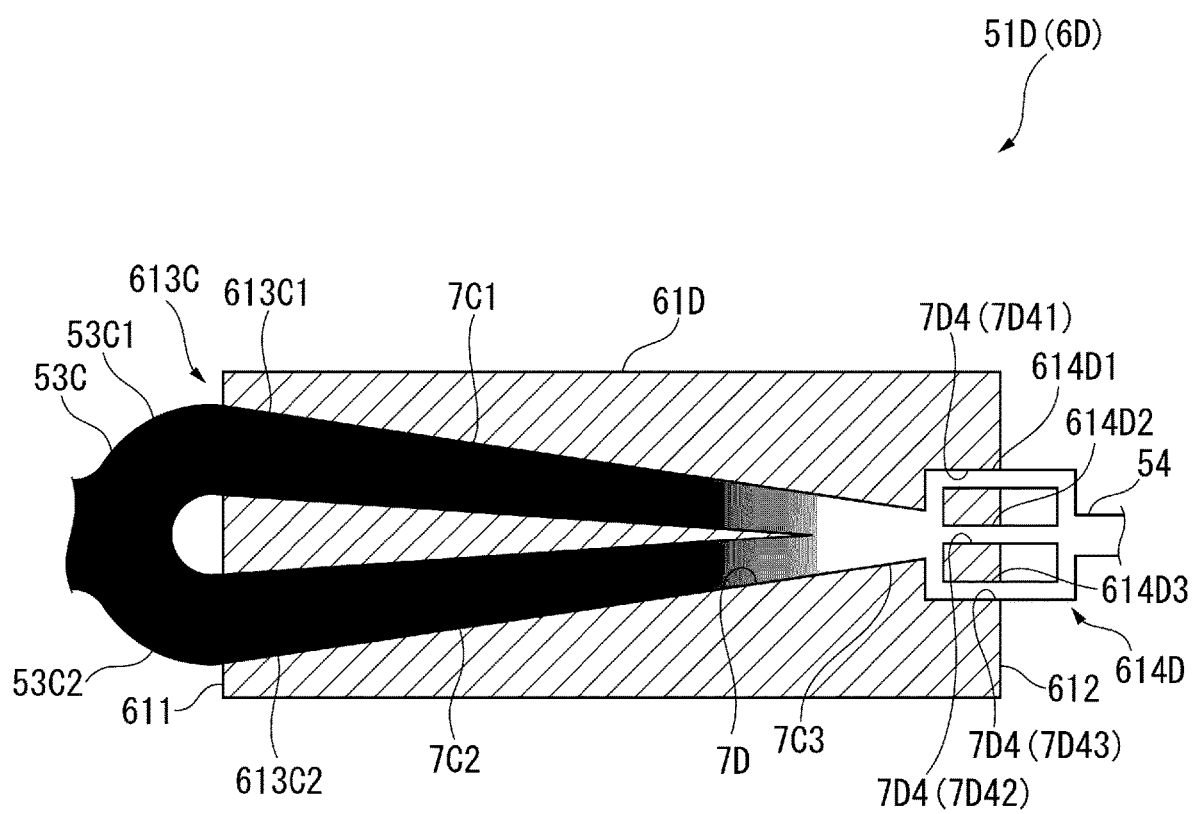
FIG. 8 is a cross-sectional view showing an internal configuration of a condenser of a cooling device provided to a projector according to a fourth embodiment of the present disclosure.

FIG. 8 is a cross-sectional view showing a condenser 6D of a cooling device provided to the projector according to the present embodiment.

The projector according to the present embodiment has substantially the same configuration and functions as those of the projector described in the third embodiment except the point that a loop heat pipe 51D is provided instead of the loop heat pipe 51C. In other words, the cooling device 5 provided to the projector according to the present embodiment is provided with the loop heat pipe 51D and the cooling fan 55. The loop heat pipe 51D is provided with the evaporator 52, the vapor pipe 53C, a condenser 6D and the liquid pipe 54, and functions similarly to the loop heat pipe 51A.

As shown in FIG. 8, the condenser 6D is provided with a main body part 61D to which the vapor pipe 53C and the liquid pipe 54 are connected, and the heat radiator not shown.

The main body part 61D has substantially the same configuration and functions as those of the main body part 61C except the point that a liquid pipe connector 614D and a phase change flow channel 7D are provided instead of the vapor pipe connector 614 and the phase change flow channel 7C.

The phase change flow channel 7D has the two inflow channels 7C1, 7C2 described above, the junction channel 7C3 and a plurality of branched flow channels 7D4, wherein the junction channel 7C3 is communicated with the two inflow channels 7C1, 7C2, the working fluid having flowed through the inflow channel 7C1 and the working fluid having flowed through the inflow channel 7C2 join each other in the junction channel 7C3, and the plurality of branched flow channels 7D4 is located downstream of the working fluid with respect to the junction channel 7C3.

The plurality of branched flow channels 7D4 is branched from the junction channel 7C3, and extends toward the liquid pipe 54. The plurality of branched flow channels 7D4 is formed so that the working fluid in the liquid phase joined in the junction channel 7C3 can flow through each of the branched flow channels 7D4. Further, the flow channel cross-sectional area of each of the branched flow channels 7D4 is set to a size with which the capillary force capable of transporting the working fluid in the liquid phase toward the liquid pipe 54 is generated.

It should be noted that although in the present embodiment, the plurality of branched flow channels 7D4 includes three branched flow channels 7D41, 7D42 and 7D43, the number of the branched flow channels 7D4 can arbitrarily be changed as long as the number is no smaller than 2.

Further, in the example shown in FIG. 8, out of the branched flow channels 7D4, the branched flow channel 7D41 extends upward in FIG. 8 and then extends toward the liquid pipe 54, the branched flow channel 7D42 extends from the junction channel 7C3 toward the liquid pipe 54, and the branched flow channel 7D43 extends downward in FIG. 8 and then extends toward the liquid pipe 54. However, the extending direction of each of the branched flow channels can arbitrarily be changed.

Since such a plurality of branched flow channels 7D4 is provided to the phase change flow channel 7D, it is possible to further increase the contact area between the working fluid in the liquid phase and the main body part 61D, and thus, it is possible to perform more efficient cooling of the working fluid in the liquid phase.

The liquid pipe connector 614D is located in the end part 612, combines the branched flow channels 7D4 with each other, and is connected to the liquid pipe 54. The liquid pipe connector 614D has an outflow port 614D1, an outflow port 614D2 and an outflow port 614D3, wherein the outflow port 614D1 is connected to the branched flow channel 7D41 to make the working fluid in the liquid phase flow out, the outflow port 614D2 is connected to the branched flow channel 7D42 to make the working fluid in the liquid phase flow out, and the outflow port 614D3 is connected to the branched flow channel 7D43 to make the working fluid in the liquid phase flow out. In other words, the condenser 6D has a plurality of outflow ports 614D1, 614D2 and 614D3 from which the working fluid in the liquid phase flows out. Therefore, the working fluid in the liquid phase having flowed through each of the branched flow channels 7D4 flows into the liquid pipe 54 via the liquid pipe connector 614D.

It should be noted that in the present embodiment, at least a part of the liquid pipe connector 614D is located outside the main body part 61D. However, this is not a limitation, and it is also possible for the liquid pipe connector 614D to be located inside the main body part 61D to constitute a part of the phase change flow channel 7D.

Advantages of Fourth Embodiment

According to the projector related to the present embodiment described hereinabove, in addition to the advantages substantially the same as those of the projector according to the third embodiment, the following advantages can be obtained.

The phase change flow channel 7D has the plurality of branched flow channels 7D4 in addition to the inflow channels 7C1, 7C2 and the junction channel 7C3, wherein the plurality of branched flow channels 7D4 is located downstream the working fluid with respect to the junction channel 7C3, and is branched from the junction channel 7C3 to extend toward the liquid pipe 54. According to this configuration, it is possible to further increase the contact area between the working fluid in the liquid phase and the main body part 61D of the condenser 6D. Therefore, it is possible to further enhance the cooling efficiency of the working fluid, and thus, it is possible to further enhance the cooling efficiency of the light source 411 as the cooling target.

Modifications of Embodiments

The present disclosure is not limited to the embodiments described above, but includes modifications, improvements, and so on in the range where the advantages of the present disclosure can be achieved.

In the first embodiment described above, it is assumed that the whole of the phase change flow channel 7A is the reduced diameter part 71 decreasing in the flow channel cross-sectional area toward the downstream direction. Further, in the second embodiment described above, it is assumed that the whole of the first flow channel 7B1 forms the reduced diameter part 71, and in the third and fourth embodiments described above, it is assumed that the whole of each of the inflow channels 7C1, 7C2 forms the reduced diameter part 71. However, this is not a limitation, and it is also possible to make a part of the phase change flow channel 7A, a part of the first flow channel 7B1, or a part of each of the inflow channels 7C1, 7C2 form the reduced diameter part 71. It is also possible to dispose the reduced diameter part 71 corresponding to the volume change of the working fluid in, for example, a region where it is forecasted that the phase state of the working fluid changes from the vapor phase to the liquid phase in the phase change flow channel 7A, the first flow channel 7B1 and the inflow channels 7C1, 7C2.

In the second embodiment, it is assumed that the phase change flow channel 7B has the first flow channel 7B1, the plurality of second flow channels 7B2 and the third flow channel 7B3, wherein the plurality of second flow channels 7B2 is branched from the downstream part of the first flow channel 7B1, and the third flow channel 7B3 joins the working fluid having flowed through the plurality of second flow channels 7B2. However, this is not a limitation, and the third flow channel 7B3 can be eliminated. In this case, it is sufficient to make the working fluid in the liquid phase having flowed through the second flow channels 7B2 flow into the liquid pipe 54 in the outside of the main body part 61B similarly to the liquid pipe connector 614D described in the fourth embodiment described above.

In the third and fourth embodiments described above, it is assumed that the phase change flow channels 7C, 7D each have the two inflow channels 7C1, 7C2. However, this is not a limitation, and the number of the inflow channels which are provided to the main body part 61C, 61D, and into which the working fluid in the vapor phase inflows can arbitrarily be changed as long as the number is no smaller than 2.

Further, it is also possible to combine the configuration of the condenser 6B shown in the second embodiment described above and the configuration of the condenser 6C, 6D shown in the third or fourth embodiment described above with each other.

For example, when combining the configuration of the condenser 6B in the second embodiment described above and the configuration of the condenser 6C in the third embodiment described above with each other, the condenser has a plurality of inflow ports into which the working fluid in the vapor phase inflows. Further, the phase change flow channel has a plurality of first flow channels, a junction channel, a plurality of second flow channels and a third flow channel, wherein the working fluid in the vapor phase inflowing from the vapor pipe flows through the plurality of first flow channels, the plurality of first flow channels joins in the junction channel, the plurality of second flow channels is branched from the junction channel, each of the second flow channels is smaller in the flow channel cross-sectional area than each of the first flow channels, and the plurality of second flow channels joins in the third flow channel. Further, it is also possible for the plurality of second flow channels and the third flow channel to be disposed between at least one of the first flow channels and the junction channel.

Further, for example, when combining the configuration of the condenser 6B in the second embodiment described above and the configuration of the condenser 6D in the fourth embodiment described above with each other, the condenser has a plurality of inflow ports into which the working fluid in the vapor phase inflows. Further, the phase change flow channel has a plurality of first flow channels, a junction channel, a plurality of second flow channels, a third flow channel and a plurality of branched flow channels, wherein the working fluid in the vapor phase inflowing from the vapor pipe flows through the plurality of first flow channels, the plurality of first flow channels joins in the junction channel, the plurality of second flow channels is branched from the junction channel, each of the second flow channels is smaller in the flow channel cross-sectional area than each of the first flow channels, the plurality of second flow channels joins in the third flow channel, and the plurality of branched flow channels is located downstream of the working fluid with respect to the third flow channel, and is branched from the third flow channel. In this case, it is also possible to directly connect the plurality of second flow channels and the plurality of branched flow channels to each other without disposing the third flow channel. Further, similarly to the above, it is also possible for the plurality of second flow channels and the third flow channel to be disposed between at least one of the first flow channels and the junction channel.

In each of the embodiments described above, it is assumed that the cooling device 5 is provided with the loop heat pipe 51A through 51D and the cooling fan 55 as a device for cooling the light source 411 constituting the light source device 4 as the cooling target. However, this is not a limitation, and the cooling target to be cooled by the loop heat pipe 51A through 51D can also be other constituents. For example, it is also possible to use the loop heat pipe 51A through 51D as a device for cooling the light modulator or the optical elements as the cooling target.

In each of the embodiments described above, it is assumed that the condenser 6A through 6D is provided with the heat radiator not shown to which the heat of the main body part 61A through 61D is transferred besides the main body part 61A through 61D. However, this is not a limitation, and the heat radiator can be eliminated. In this case, it is also possible to dispose a heat radiator such as a radiator fin integrally on an outer surface of the main body part 61A through 61D.

Further, it is assumed that the cooling device 5 is provided with the cooling fan 55 for making the cooling gas flow through the condenser 6A through 6D besides the loop heat pipe 51A through 51D. However, this is not a limitation, and the cooling fan 55 can be eliminated. It should be noted that when disposing the cooling fan 55, the cooling fan 55 can be an axial fan, or can also be a centrifugal fan such as a sirocco fan or a turbofan. Further, it is also possible for the cooling fan 55 to be disposed at the position where the cooling gas blows against the condenser 6A through 6D.

In each of the embodiments described above, it is assumed that the heat receiving member 525 for making it easy to transfer the heat having been generated in the light source 411 to the groove member 524 is disposed between the support member 414 of the light source 411 as the cooling target and the groove member 524. However, this is not a limitation, and it is also possible for the support member 414 and the groove member 524 to be connected to each other so as to be able to transfer heat without the intervention of the heat receiving member 525.

In each of the embodiments described above, it is assumed that the light source 411 of the light source device 4 has the semiconductor lasers 412, 413. However, this is not a limitation, and it is also possible for the light source device to be a device having a light source lamp such as a super-high pressure mercury lamp, or other solid-state light sources such as light emitting diodes (LED) as the light source. In this case, the cooling target of the loop heat pipe 51A through 51D can also be the light source lamp or other solid-state light sources.

In each of the embodiments described above, it is assumed that the projector is equipped with the three light modulators 343 (343B, 343G and 343R). However, this is not a limitation, and the present disclosure can also be applied to a projector equipped with two or less, or four or more light modulators.

In each of the embodiments described above, it is assumed that the light modulators 343 are each the transmissive liquid crystal panel having the plane of incidence of light and the light exit surface different from each other. However, this is not a limitation, and it is also possible to use reflective liquid crystal panels having the plane of incidence of light and the light exit surface coinciding with each other as the light modulators. Further, it is also possible to use a light modulator other than the liquid crystal device, such as a device using a micromirror such as a digital micromirror device (DMD) providing the light modulator is capable of modulating the incident light beam to form the image corresponding to the image information.

In each of the embodiments described above, there is cited an example of applying the cooling device 5 equipped with the loop heat pipe 51A through 51D to the projector. However, this is not a limitation, and the cooling device according to the present disclosure can also be applied to other devices or equipment than the projector, and in addition, can also be used alone. In other words, the application of the cooling device according to the present disclosure is not limited to a device for cooling the constituents of the projector.

What is claimed is:

1. A cooling device comprising:
an evaporator configured to evaporate working fluid in a liquid phase due to a heat transferred from a cooling target to change to the working fluid in a vapor phase;
a condenser configured to condense the working fluid in the vapor phase to change to the working fluid in the liquid phase;
a vapor pipe through which the working fluid changed to the vapor phase in the evaporator flows into the condenser; and
a liquid pipe through which the working fluid changed to the liquid phase in the condenser flows into the evaporator, wherein:
the condenser has a phase change flow channel into which the working fluid in the vapor phase inflows via the vapor pipe, and through which the working fluid changed in phase from the vapor phase to the liquid phase flow out to the liquid pipe, and
the phase change flow channel has a reduced diameter part having a flow channel cross-sectional area gradually decreasing in a direction from upstream toward downstream of the working fluid.

2. The cooling device according to claim 1, wherein:
the phase change flow channel includes
a first flow channel through which the working fluid in the vapor phase inflowing via the vapor pipe flows, and
a plurality of second flow channels branched from the first flow channel, and
a flow channel cross-sectional area of each of the second flow channels is smaller than a flow channel cross-sectional area of the first flow channel.

3. The cooling device according to claim 1, wherein:
the condenser has a plurality of inflow ports into which the working fluid in the vapor phase inflows, and
the phase change flow channel includes
a plurality of inflow channels communicated with the plurality of inflow ports, and
a junction channel in which the plurality of inflow channels joins.

4. The cooling device according to claim 3, wherein
the phase change flow channel has a plurality of branched flow channels located downstream of the working fluid with respect to the junction channel, the branched flow channels branched from the junction channel.

5. A projector comprising:
a light source configured to emit light;
a light modulator configured to modulate the light emitted from the light source;
a projection optical device configured to project the light modulated by the light modulator; and
the cooling device according to claim 1.

6. A projector comprising:
a light source configured to emit light;
a light modulator configured to modulate the light emitted from the light source;
a projection optical device configured to project the light modulated by the light modulator; and
the cooling device according to claim 2.

7. A projector comprising:
a light source configured to emit light;
a light modulator configured to modulate the light emitted from the light source;
a projection optical device configured to project the light modulated by the light modulator; and
the cooling device according to claim 3.

8. A projector comprising:
a light source configured to emit light;
a light modulator configured to modulate the light emitted from the light source;
a projection optical device configured to project the light modulated by the light modulator; and
the cooling device according to claim 4.

9. The projector according to claim 5, wherein
the cooling target is the light source.

10. The projector according to claim 6, wherein
the cooling target is the light source.

11. The projector according to claim 7, wherein
the cooling target is the light source.

12. The projector according to claim 8, wherein
the cooling target is the light source.

* * * * *